(12) United States Patent
Ide et al.

(10) Patent No.: US 7,567,413 B2
(45) Date of Patent: Jul. 28, 2009

(54) MAGNETIC DETECTING ELEMENT WITH DIFFUSION-PREVENTING LAYER BETWEEN SPACER CU AND MAGNETIC LAYER, AND METHOD OF MANUFACTURING THE SAME

(75) Inventors: Yosuke Ide, Niigata-ken (JP);
Masamichi Saito, Niigata-ken (JP);
Masahiko Ishizone, Niigata-ken (JP);
Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 621 days.

(21) Appl. No.: 11/396,807

(22) Filed: Apr. 3, 2006

(65) Prior Publication Data
US 2006/0227467 A1    Oct. 12, 2006

(30) Foreign Application Priority Data
Apr. 8, 2005   (JP) .............................. 2005-111483

(51) Int. Cl.
*G11B 5/39*   (2006.01)
(52) U.S. Cl. .............................. 360/324.12; 360/324.11
(58) Field of Classification Search ................ 360/324, 360/324.1, 324.2, 324.11, 324.12, 314
See application file for complete search history.

(56) References Cited

U.S. PATENT DOCUMENTS

| | | | |
|---|---|---|---|
| 7,035,062 B1 * | 4/2006 | Mao et al. ................. | 360/324.2 |
| 7,158,354 B2 * | 1/2007 | Saito et al. ............. | 360/324.12 |
| 7,295,408 B2 * | 11/2007 | Saito et al. ............... | 360/324.1 |
| 2006/0044705 A1 * | 3/2006 | Hasegawa et al. ....... | 360/324.11 |
| 2006/0050446 A1 * | 3/2006 | Ishizone et al. ......... | 360/324.12 |
| 2006/0203396 A1 * | 9/2006 | Ide et al. ................... | 360/324.1 |
| 2006/0215330 A1 * | 9/2006 | Ide et al. ................... | 360/324.1 |
| 2007/0109693 A1 * | 5/2007 | Carey et al. ............ | 360/324.12 |
| 2007/0115596 A1 * | 5/2007 | Nakabayashi et al. ....... | 360/324 |
| 2007/0297103 A1 * | 12/2007 | Zhang et al. ........... | 360/324.12 |

FOREIGN PATENT DOCUMENTS

| | | |
|---|---|---|
| JP | 2003-309305 | 10/2003 |
| JP | 2003-338644 | 11/2003 |
| JP | 2004-39941 | 2/2004 |
| JP | 2004-146480 | 5/2004 |

* cited by examiner

*Primary Examiner*—William J Klimowicz
(74) *Attorney, Agent, or Firm*—Brinks Hofer Gilson & Lione

(57) ABSTRACT

There is provided a magnetic detecting element by devising a configuration of a free magnetic layer or a pinned magnetic layer, and a method of manufacturing a magnetic detecting element. The free magnetic layer is formed to have a three-layered structure of a CoMnZ alloy layer, a CoMnX alloy layer, and a CoMnZ alloy layer. The CoMnX alloy layer is formed of a metal compound whose compositional formula is represented by $Co_aMn_bX_c$ (X is one or more elements selected from a group of Ge, Sn, Ga, and Sb, a, b, and c are atomic percent, and a+b+c=100 atomic percent). The CoMnZ alloy layer is formed of a metal compound whose compositional formula is represented by $Co_dMn_eZ_f$ (Z is Al or Si, d, e, and f are atomic percent, and d+e+f=100 atomic percent).

16 Claims, 6 Drawing Sheets

MAGNETIC DETECTING ELEMENT WITH DIFFUSION-PREVENTING LAYER BETWEEN SPACER CU AND MAGNETIC LAYER, AND METHOD OF MANUFACTURING THE SAME

BACKGROUND OF THE INVENTION

1. Field of the Invention

The present invention relates to a magnetic detecting element having a pinned magnetic layer whose magnetization direction is fixed in one direction and a free magnetic layer formed on the pinned magnetic layer with a nonmagnetic material layer interposed therebetween. More particularly, the present invention relates to a magnetic detecting element which can stabilize reproduction power.

2. Description of the Related Art

FIG. 8 is a partial cross-sectional view of a magnetic detecting element according to the related art (spin-valve type thin film element) taken along a direction parallel to an opposing surface to a recording medium.

In FIG. 8, reference numeral 1 denotes a base layer formed of Ta. On the base layer 1, a seed layer 2 formed of NiFeCr is formed.

A multilayer film T is formed by laminating an antiferromagnetic layer 3, a pinned magnetic layer 4, a nonmagnetic material layer 5, a free magnetic layer 6, and a protective layer 7 in that order on the seed layer 2.

The free magnetic layer 6 and the pinned magnetic layer 4 are formed of a Heusler alloy, such as $Co_2MnGe$ or the like. The nonmagnetic material layer 5 is formed of Cu, and the antiferromagnetic layer 3 is formed of PtMn. Further, the protective layer 7 is formed of Ta.

An exchange coupling magnetic field is generated at the interface between the antiferromagnetic layer 3 and the pinned magnetic layer 4, and the magnetization of the pinned magnetic layer 4 is fixed in a height direction (in FIG. 8, Y direction).

On both sides of the free magnetic layer 6, hard bias layers 8 are formed of hard magnetic material such as CoPt, and the top, bottom, and end portions of each of the hard bias layer 8 are insulated by an insulating layer 9. By a longitudinal bias magnetic field from the hard bias layers 8, the magnetization of the free magnetic layer 6 is aligned in a track width direction (in FIG. 8, X direction). On the top and bottom of the multilayer film T, electrode layers 10 and 10 are formed.

If an external magnetic field is applied to the magnetic detecting element shown in FIG. 8, the magnetization direction of the free magnetic layer 6 is relatively changed with respect to the magnetization direction of the pinned magnetic layer 4, and then a resistance value of the multilayer film is changed. When a sense current having a predetermined current value is flowing, by detecting the change in resistance value as a change in voltage, the external magnetic field is detected.

The magnetic detecting element having the pinned magnetic layer formed of the Heusler alloy is described in JP-A-2003-309305 (page 8 and FIG. 4).

FIG. 9 is a partial schematic view showing the magnetic detecting element shown in FIG. 8 on a magnified scale. It is difficult to make the surface of the pinned magnetic layer 4 a completely planarized surface, and normally, fine waviness occurs at the surface. If waviness occurs at the surface of the pinned magnetic layer 4, similar waviness also occurs at the surfaces of the nonmagnetic material layer 5 and the free magnetic layer 6.

FIG. 9 is a schematic view showing sections of the pinned magnetic layer 4, the nonmagnetic material layer 5, and the free magnetic layer 6 taken along the Y direction. If such waviness occurs, as shown in FIG. 9, magnetic poles occur at the wavy portion of the surface of the pinned magnetic layer 4. The magnetic poles also occur at the wavy portion of the free magnetic layer 6 facing the pinned magnetic layer 4 with the nonmagnetic material layer 5 interposed therebetween. Accordingly, a ferromagnetic coupling magnetic field $H_{in}$ caused by magnetostatic coupling (topological coupling) between the pinned magnetic layer 4 and the free magnetic layer 6 becomes stronger. Therefore, the free magnetic layer 6, which should be magnetized in an X direction of FIG. 9, is magnetized in a Y direction of FIG. 9. As a result, there is a problem in that asymmetry of reproduction waveforms when an external magnetic field whose direction is shifted by 180 degrees is applied is increased.

SUMMARY OF THE INVENTION

The invention has been finalized in order to solve the problems inherent in the related art, and it is an object of the invention to provide a magnetic detecting element which can realize high reproduction power and reduce asymmetry of reproduction waveforms by devising a configuration of a free magnetic layer or a pinned magnetic layer, and a method of manufacturing a magnetic detecting element.

According to a first aspect of the invention, a magnetic detecting element includes a pinned magnetic layer whose magnetization direction is fixed in one direction, and a free magnetic layer that is formed on the pinned magnetic layer with a nonmagnetic material layer interposed therebetween. One or both of the pinned magnetic layer and the free magnetic layer have a laminated structure of a CoMnX alloy layer formed of a metal compound whose compositional formula is represented by $Co_aMn_bX_c$ (X is one or more elements selected from a group of Ge, Sn, Ga, and Sb, a, b, and c are atomic percent, and a+b+c=100 atomic percent) and a CoMnZ alloy layer formed of a metal compound whose compositional formula is represented by $Co_dMn_eZ_f$ (Z is Al or Si, d, e, and f are atomic percent, and d+e+f=100 atomic percent). The CoMnZ alloy layer is located close to the nonmagnetic material layer.

According to this configuration, the CoMnZ alloy layer exists between the CoMnX alloy layer and the nonmagnetic material layer. The element Z is Al, Si, or AlSi. The elements of the CoMnZ alloy layer are rarely diffused to the nonmagnetic material layer. For this reason, a ferromagnetic coupling magnetic field $H_{in}$ by a magnetostatic coupling (topological coupling) between the free magnetic layer and the pinned magnetic layer can be reduced.

Further, by arranging a CoMnX alloy having a high spin-dependent bulk scattering coefficient β at a position distant from the nonmagnetic material layer, a product ΔRA of the amount of a change in magnetoresistance ΔR of the magnetic detecting element and an element area A can be maintained high.

As such, the magnetic detecting element according to the first aspect of the invention can realize high reproduction power and reduce asymmetry of reproduction waveforms.

In the magnetic detecting element according to the first aspect of the invention, between the CoMnX alloy layer and the CoMnZ alloy layer, a CoMnXZ alloy layer formed of a metal compound whose compositional formula is represented by $Co_gMn_hX_iZ_j$ (X is one or more elements selected from a group Ge, Sn, Ga, and Sb, Z is Al or Si, g, h, i, and j are atomic percent, and g+h+i+j=100 atomic percent) may be interposed.

If the magnetic detecting element according to the first aspect of the invention is formed by using a method of manufacturing a magnetic detecting element described below, the material of the CoMnX alloy layer and the material of the CoMnZ alloy layer are diffused so as to form the CoMnXZ alloy layer. At this time, in the CoMnXZ alloy layer, a region where, as getting near to the nonmagnetic material layer, the concentration of the element X becomes lower and the concentration of the element Z become higher may exist.

By setting the film thickness of the CoMnZ alloy layer in a range of 1 Å to 10 Å, the material of the CoMnX alloy layer, in particular, one or more elements selected from the group of Ge, Sn, Ga, and Sb, can be prevented from being diffused. As a result, the ferromagnetic coupling magnetic field $H_{in}$ by magnetostatic coupling (topological coupling) between the free magnetic layer and the pinned magnetic layer can be reduced.

Moreover, if the ratio a:b:c of the metal compound, which is the material of the CoMnX alloy layer and whose compositional formula is represented by $Co_aMn_bX_c$ (X is one or more elements selected from the group of Ge, Sn, Ga, and Sb, a, b, and c are atomic percent, and a+b+c=100 atomic percent) is 2:1:1, the crystal structure of the CoMnX alloy layer becomes an $L_{21}$ type, and thus the spin-dependent bulk scattering coefficient β can be increased.

In addition, if the ratio d:e:f of the metal compound, which is the material of the CoMnZ alloy layer and whose compositional formula is represented by $Co_dMn_eZ_f$ (Z is Al or Si, d, e, and f are atomic percent, and d+e+f=100 atomic percent), is 2:1:1, the crystal structure of the CoMnZ alloy layer becomes an $L_{21}$ type, and thus the spin-dependent bulk scattering coefficient β can be increased.

Further, according to a second aspect of the invention, a magnetic detecting element includes a pinned magnetic layer whose magnetization direction is fixed in one direction, and a free magnetic layer that is formed on the pinned magnetic layer with a nonmagnetic material layer interposed therebetween. One or both of the pinned magnetic layer and the free magnetic layer have a laminated structure of a CoMnX alloy layer formed of a metal compound whose compositional formula is represented by $Co_aMn_bX_c$ (X is one or more elements selected from a group of Ge, Sn, Ga, and Sb, a, b, and c are atomic percent, and a+b+c=100 atomic percent), and a magnetic coupling-preventing layer. The magnetic coupling-preventing layer is located close to the nonmagnetic material layer. The magnetic coupling-preventing layer is formed of a half-metal ferromagnetic material, such that, when a pair of thin films formed of the ferromagnetic material are laminated with a Cu layer having a thickness of 43 Å interposed therebetween, a ferromagnetic coupling magnetic field $H_{in}$ is 1600 A/m or less.

The magnetic detecting element according to the first aspect of the invention may further include an antiferromagnetic layer. The pinned magnetic layer may be formed to be brought into contact with the antiferromagnetic layer, such that the magnetization direction thereof is fixed by an exchange anisotropy magnetic field with the antiferromagnetic layer. The free magnetic layer may be formed on the pinned magnetic layer with the nonmagnetic material layer interposed therebetween.

Further, the magnetic detecting element according to the first aspect of the invention may be a so-called dual spin-valve type magnetoresistive element, in which the nonmagnetic material layer has nonmagnetic material layers that are laminated above and below the free magnetic layer, and the pinned magnetic layer has pinned magnetic layers that are located above one of the nonmagnetic material layers and below the other nonmagnetic material layer.

The dual spin-valve type magnetoresistive element may further include antiferromagnetic layers that are located above one of the pinned magnetic layers and below the other pinned magnetic layer so as to fix the magnetization directions of the individual pinned magnetic layers in a predetermined direction by an exchange anisotropy magnetic field.

The magnetic detecting element according to the first aspect of the invention may be a so-called CPP (Current Perpendicular to the Plane)-GMR type magnetic detecting element, in which a sense current flows in a direction perpendicular to the film surface of each of the pinned magnetic layer, the nonmagnetic material layer, and the free magnetic layer.

According to a third aspect of the invention, there is provided a method of manufacturing a magnetic detecting element, the magnetic detecting device having a pinned magnetic layer whose magnetization direction is fixed, and a free magnetic layer that is formed on the pinned magnetic layer with a nonmagnetic material layer interposed therebetween, and whose magnetization direction is changed by an external magnetic field. The method of manufacturing a magnetic detecting element includes forming one or both of the pinned magnetic layer and the free magnetic layer to have a laminated structure of a CoMnX alloy layer formed of a metal compound whose compositional formula is represented by $Co_aMn_bX_c$ (X is one or more elements selected from a group of Ge, Sn, Ga, and Sb, a, b, and c are atomic percent, and a+b+c=100 atomic percent) and a CoMnZ alloy layer formed of a metal compound whose compositional formula is represented by $Co_dMn_eZ_f$ (Z is Al or Si, d, e, and f are atomic percent, and d+e+f=100 atomic percent). The CoMnZ alloy layer is located close to the nonmagnetic material layer.

The method of manufacturing a magnetic detecting element according to the third aspect of the invention may further include, after laminating the CoMnX alloy layer and the CoMnZ alloy layer, performing a thermal treatment. With this thermal treatment, the CoMnX alloy layer and the CoMnZ alloy layer are ordered to have the $L_{21}$ type crystal structure. Therefore, the spin-dependent bulk scattering coefficients β of the CoMnX alloy layer and the CoMnZ alloy layer can be increased.

During the thermal treatment, between the CoMnX alloy layer and the CoMnZ alloy layer, a CoMnXZ alloy layer formed of a metal compound whose compositional formula is represented by $Co_gMn_hX_iZ_j$ (X is one or more elements selected from a group Ge, Sn, Ga, and Sb, Z is Al or Si, g, h, i, and j are atomic percent, and g+h+i+j=100 atomic percent) may be formed. In the CoMnXZ alloy layer, a region where, as getting near to the nonmagnetic material layer, the concentration of the element X becomes lower and the concentration of the element Z become higher may exist.

In the method of manufacturing a magnetic detecting element according to the third aspect of the invention, it is preferable that the film thickness of the CoMnZ alloy layer be in a range of 1 Å to 10 Å.

Moreover, if the ratio a:b:c of the metal compound, which is the material of the CoMnX alloy layer and whose compositional formula is represented by $Co_aMn_bX_c$ (X is one or more elements selected from the group of Ge, Sn, Ga, and Sb, a, b, and c are atomic percent, and a+b+c=100 atomic percent) is 2:1:1, the crystal structure of the CoMnX alloy layer becomes an $L_{21}$ type, and thus the spin-dependent bulk scattering coefficient β can be increased.

In addition, if the ratio d:e:f of the metal compound, which is the material of the CoMnZ alloy layer and whose compositional formula is represented by $Co_dMn_eZ_f$ (Z is Al or Si, d, e, and f are atomic percent, and d+e+f=100 atomic percent), is 2:1:1, the crystal structure of the CoMnZ alloy layer becomes an $L_{21}$ type, and thus the spin-dependent bulk scattering coefficient β can be increased.

According to this configuration, the CoMnZ alloy layer exists between the CoMnX alloy layer and the nonmagnetic material layer. The element Z is Al, Si, or AlSi. The elements of the CoMnZ alloy layer are rarely diffused to the nonmagnetic material layer. For this reason, the ferromagnetic coupling magnetic field $H_{in}$ by a magnetostatic coupling (topological coupling) between the free magnetic layer and the pinned magnetic layer can be reduced.

Further, by arranging a CoMnX alloy having a high spin-dependent bulk scattering coefficient β at a position distant from the nonmagnetic material layer, the product ΔRA of the amount of the change in magnetoresistance ΔR of the magnetic detecting element and the element area A can be maintained high.

As such, the magnetic detecting element manufactured according to the third aspect of the invention can realize high reproduction power and reduce asymmetry of reproduction waveforms.

According to the above-described configurations, since the ferromagnetic coupling magnetic field $H_{in}$ between the free magnetic layer and the pinned magnetic layer is reduced, the film thickness formed between the free magnetic layer and the pinned magnetic layer can be made small. Therefore, the film thickness of the entire magnetic detecting element according to the invention can be made small, thereby narrowing the gap of a reproduction magnetic head.

DESCRIPTION OF THE PREFERRED EMBODIMENT

Figure 1:
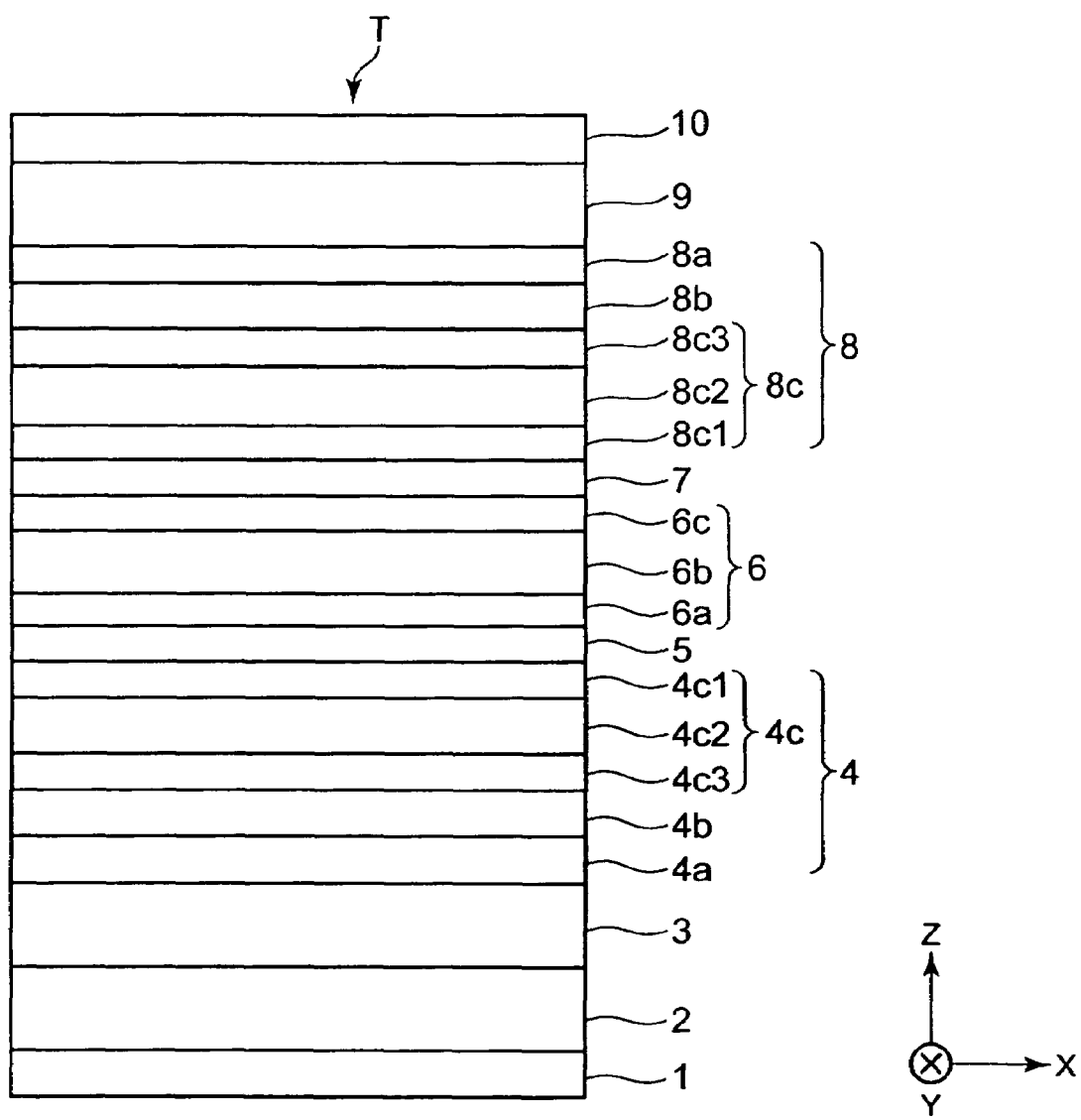
FIG. 1 is a schematic view showing a structure of a magnetic detecting element (dual spin-valve type thin film element) according to an embodiment of the invention as viewed from an opposing surface to a recording medium.

FIG. 1 is a schematic view showing the laminated structure of a CPP dual spin-valve type thin film element according to an embodiment of the invention.

The dual spin-valve type thin film element is disposed on, for example, a trailing end of a floating slider provided in a hard disc device so as to detect a recording magnetic field from a hard disc or the like. Moreover, a magnetic recording medium, such as a hard disc or the like, moves in a Z direction, and a magnetic field leaks from the magnetic recording medium in a Y direction.

The bottom layer in FIG. 1 is a base layer 1 formed of a nonmagnetic material, such as one or more elements selected from a group of Ta, Hf, Nb, Zr, Ti, Mo, and W. A seed layer 2 is provided on the base layer 1. The seed layer 2 is formed of NiFeCr or Cr. If the seed layer 2 is formed of NiFeCr, the seed layer 2 has a face-centered cubic (fcc) structure in which an equivalent crystal plane represented by a {111} plane is preferentially aligned in a direction parallel to the film surface. Further, if the seed layer 2 is formed of Cr, the seed layer 2 has a body-centered cubic (bcc) structure in which an equivalent crystal plane represented by a {110} plane is preferentially aligned in the direction parallel to the film surface.

Moreover, the base layer 1 has a nearly amorphous structure and may not be formed in some cases.

An antiferromagnetic layer 3 formed on the seed layer 2 is preferably formed of an antiferromagnetic material containing X (where X is one or more elements selected from a group of Pt, Pd, Ir, Rh, Ru, and Os) and Mn.

As the antiferromagnetic material, the X-Mn alloy based on the platinum-group element has advantageous advantages, such as excellent corrosion resistance, a high blocking temperature, and an ability to increase an exchange coupling magnetic field (Hex).

Further, in the invention, the antiferromagnetic layer 3 may be formed of an antiferromagnetic material containing X, X' (where X' is one or more elements selected from a group of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and a rare-earth element), and Mn.

The atomic percent of the element X or X+X' of the antiferromagnetic layer 3 is preferably in a range of 45 atomic percent to 60 atomic percent, and more preferably, in a range of 49 atomic percent to 56.5 atomic percent. Accordingly, at the time of forming, it is ensured that a non-aligned state is held at the interface with the antiferromagnetic layer 3 and a pinned magnetic layer 4, and the antiferromagnetic layer 3 develops appropriate regular transformation by a thermal treatment.

A lower pinned magnetic layer 4 is formed to have a multilayer film structure of a first pinned magnetic layer 4a, a nonmagnetic intermediate layer 4b, and a second pinned magnetic layer 4c. By the exchange coupling magnetic field at the interface between the lower pinned magnetic layer 4 and the antiferromagnetic layer 3 and an antiferromagnetic exchange coupling magnetic field (RKKY interaction) through the nonmagnetic intermediate layer 4b, the magnetization directions of the first pinned magnetic layer 4a and the second pinned magnetic layer 4c are placed in an antiparallel state. This is called a laminated ferri structure. According to this structure, the magnetization of the lower pinned magnetic layer 4 can be stabilized. Further, the exchange coupling magnetic field generated at the interface between the lower pinned magnetic layer 4 and the antiferromagnetic layer 3 can be seemingly increased.

The lower pinned magnetic layer 4 may be constituted by only the second pinned magnetic layer 4c so as not to have the laminated ferri structure.

Moreover, the first pinned magnetic layer 4a is formed in a range of about 15 Å to 35 Å, the nonmagnetic intermediate layer 4b is formed in a range of about 8 Å to 10 Å, and the second pinned magnetic layer 14c is formed in a range of about 20 Å to 60 Å.

The first pinned magnetic layer 4a is formed of a ferromagnetic material, such as CoFe, NiFe, or CoFeNi. Further, the nonmagnetic intermediate layer 4b is formed of a nonmagnetic conductive material, such as Ru, Rh, Ir, Cr, Re, or Cu.

The second pinned magnetic layer 4c is formed to have a layered structure of a CoMnZ alloy layer 4c1 in contact with a nonmagnetic material layer 5, a CoMnX alloy layer 4c2, and a nonmagnetic intermediate layer-side magnetic layer 4c3. The nonmagnetic intermediate layer-side magnetic layer 4c3 is formed of a ferromagnetic material, such as CoFe, CoFeNi, or the like.

The nonmagnetic material layer 5 formed on the pinned magnetic layer 4 is formed of Cu, Au, or Ag. The nonmagnetic material layer 5 formed of Cu, Au, or Ag has a face-centered cubic (fcc) structure in which an equivalent crystal plane represented by a {111} plane is preferentially aligned in a direction parallel to the film surface.

A free magnetic layer 6 is formed on the nonmagnetic material layer 5. The free magnetic layer 6 has a three-layered structure of a CoMnZ alloy layer 6a, CoMnX alloy layer 6b, and a CoMnZ alloy layer 6c.

A nonmagnetic material layer 7 is formed on the free magnetic layer 6. A material for the nonmagnetic material layer 7 is selected from the materials used for the nonmagnetic material layer 5 described above. An upper pinned magnetic layer 8 is formed on the nonmagnetic material layer 7. The upper pinned magnetic layer 8 has a laminated ferri structure in which a second pinned magnetic layer 8c, a nonmagnetic intermediate layer 8b, and a first pinned magnetic layer 8a are laminated in that order from the bottom. Materials for the first pinned magnetic layer 8a, the nonmagnetic intermediate layer 8b, and the second pinned magnetic layer 8c are individually selected from the materials used for the first pinned magnetic layer 4a, the nonmagnetic intermediate layer 4b, and the second pinned magnetic layer 4c. Further, like the second pinned magnetic layer 4c, the second pinned magnetic layer 8c is formed to have a three-layered structure of CoMnZ alloy layer 8c1 in contact with the nonmagnetic material layer 7, a CoMnX alloy layer 8c2, and a nonmagnetic intermediate layer-side magnetic layer 8c3. Further, the upper pinned magnetic layer 8 may be constituted by only the second pinned magnetic layer 8c.

An upper antiferromagnetic layer 9 is formed on the upper pinned magnetic layer 8. A material for the upper antiferromagnetic layer 9 is selected from the materials used for the lower antiferromagnetic layer 3. A protective layer 10 formed of Ta or the like is formed on the upper antiferromagnetic layer 9.

The free magnetic layer 6 is magnetized in a direction parallel to a track width direction (X direction in FIG. 1). On the other hand, the first pinned magnetic layers 4a and 8a and the second pinned magnetic layers 4c and 8c constituting the pinned magnetic layers 4 and 8 are magnetized in a height direction (Y direction in FIG. 1). Since the pinned magnetic layers 4 and 8 have the laminated ferri structure, the first pinned magnetic layers 4a and 8a and the second pinned magnetic layers 4c and 8c are magnetized in antiparallel.

This embodiment has features in that the second pinned magnetic layer 4c of the lower pinned magnetic layer 4 is formed to have the layered structure of the CoMnZ alloy layer 4c1 in contact with the nonmagnetic material layer 5, the CoMnX alloy layer 4c2, and the nonmagnetic intermediate layer-side magnetic layer 4c3, the second pinned magnetic layer 8c of the upper pinned magnetic layer 8 is formed to have the three-layered structure of the CoMnZ alloy layer 8c1, the CoMnX alloy layer 8c2, and the nonmagnetic intermediate layer-side magnetic layer 8c3, and the free magnetic layer 6 is formed to have the three-layered structure of the CoMnZ alloy layer 6a, the CoMnX alloy layer 6b, and the CoMnZ alloy layer 6c.

The CoMnX alloy layer is a layer formed of a metal compound whose compositional formula is represented by $Co_aMn_bX_c$ (X is one or more elements selected from a group of Ge, Sn, Ga, and Sb, a, b, and c are atomic percent, and a+b+c=100 atomic percent). Further, the CoMnZ alloy layer is a layer formed of a metal compound whose compositional formula is represented by $Co_dMn_eZ_f$ (Z is Al or Si, d, e, and f are atomic percent, and d+e+f=100 atomic percent).

In the magnetic detecting element shown in FIG. 1, the CoMnZ alloy layer exists between the CoMnX alloy layer and the nonmagnetic material layer. The element Z is Al, Si, or AlSi. The elements of a CoMnZ alloy are rarely diffused to the nonmagnetic material layer. For this reason, a ferromagnetic coupling magnetic field $H_{in}$ by magnetostatic coupling (topological coupling) between the free magnetic layer 6 and the lower pinned magnetic layer 4, and between the free magnetic layer 6 and the upper pinned magnetic layer 8 can be reduced.

Further, by arranging the CoMnX alloy having a high spin-dependent bulk scattering coefficient β at a position distant from the nonmagnetic material layer, a product ΔRA of the amount of a change in magnetoresistance ΔR of the magnetic detecting element and an element area A can be maintained high.

As such, the magnetic detecting element shown in FIG. 1 can realize high reproduction power and reduce asymmetry of reproduction waveforms.

By setting the film thickness of each of the CoMnZ alloy layers 4c1, 6a, 6c, and 8c1 in a range of 1 Å to 10 Å, the materials of the CoMnX alloy layers 4c2, 6b, and 8c2, in particular, one or more elements selected from the group of Ge, Sn, Ga, and Sb, can be prevented from being diffused to the nonmagnetic material layers 5 and 7.

Moreover, if the ratio a:b:c of the metal compound, which is the material of each of the CoMnX alloy layers 4c2, 6b, and 8c2 and whose compositional formula is represented by $Co_aMn_bX_c$ (X is one or more elements selected from the group of Ge, Sn, Ga, and Sb, a, b, and c are atomic percent, and a+b+c=100 atomic percent) is 2:1:1, the crystal structure of the CoMnX alloy layer becomes an $L_{21}$ type, and thus the spin-dependent bulk scattering coefficient β can be increased.

In addition, if the ratio d:e:f of the metal compound, which is the material of each of the CoMnZ alloy layers 4c1, 6a, 6c, and 8c1 and whose compositional formula is represented by $Co_dMn_eZ_f$ (Z is Al or Si, d, e, and f are atomic percent, and d+e+f=100 atomic percent), is 2:1:1, the crystal structure of the CoMnZ alloy layer becomes an $L_{21}$ type, and thus the spin-dependent bulk scattering coefficient β can be increased.

Moreover, a CoMnXZ alloy layer formed of a metal compound whose compositional formula is represented by $Co_gMn_hX_iZ_j$ (X is one or more elements selected from a group Ge, Sn, Ga, and Sb, Z is Al or Si, g, h, i, and j are atomic percent, and g+h+i+j=100 atomic percent) may be interposed between the CoMnX alloy layer and the CoMnZ alloy layer.

Figure 2:
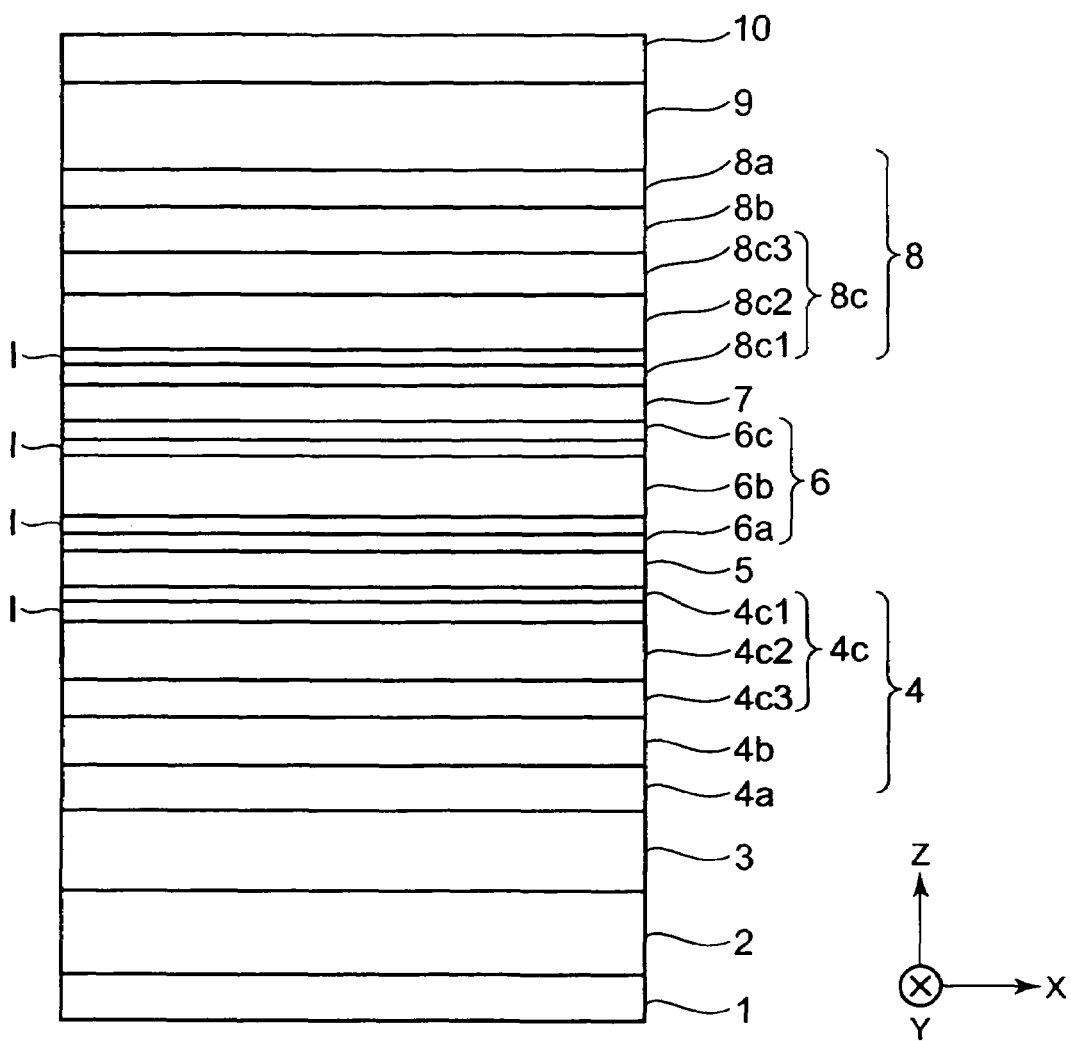
FIG. 2 is a schematic view showing a structure of a magnetic detecting element (dual spin-valve type thin film element) according to another embodiment of the invention as viewed from an opposing surface to a recording medium.

FIG. 2 is a schematic view showing the film configuration of a magnetic detecting element in which CoMnXZ alloy layers I are individually interposed between a CoMnZ alloy layer 4c1 and a CoMnX alloy layer 4c2, between a CoMnZ alloy layer 6a and a CoMnX alloy layer 6b, between a CoMnZ alloy layer 6c and a CoMnX alloy layer 6b, and between a CoMnZ alloy layer 8c1 and a CoMnX alloy layer 8c2.

At the time of manufacturing the magnetic detecting element shown in FIG. 2, a multilayer film T is formed by laminating a base layer 1, a seed layer 2, an antiferromagnetic layer 3, a first pinned magnetic layer 4a, a nonmagnetic intermediate layer 4b, a second pinned magnetic layer 4c (a nonmagnetic intermediate layer-magnetic layer 4c3, a CoMnX alloy layer 4c2, and a CoMnZ alloy layer 4c1), a nonmagnetic material layer 5, a free magnetic layer 6 (a CoMnZ alloy layer 6a, a CoMnX alloy layer 6b, and a CoMnZ alloy layer 6c), a nonmagnetic material layer 7, a second pinned magnetic layer 8c (a CoMnZ alloy layer 8c1, a CoMnX alloy layer 8c2, and a nonmagnetic intermediate layer-side magnetic layer 8c3), a nonmagnetic intermediate layer 8b, a first pinned magnetic layer 8a, an antiferromagnetic layer 9, and a protective layer 10 in that order. And then, the multilayer film T is subjected to a thermal treatment. The thermal treatment is performed at a temperature 290° C. for 3.5 hours.

If the thermal treatment is applied in a state in which the CoMnX alloy layer and the CoMnZ alloy layer are superimposed, the material of the CoMnX alloy layer and the material of the CoMnZ alloy layer are diffused so as to form the CoMnXZ alloy layer I. At this time, in the CoMnXZ alloy layer I, a region where, when getting near to the nonmagnetic material layer 5 or the nonmagnetic material layer 7, the concentration of the element X becomes lower and the concentration of the element Z becomes higher exists.

By setting the film thickness of each of the CoMnZ alloy layers 4c1, 6a, 6c, and 8c1 in a range of 1 Å to 10 Å, the materials of the CoMnX alloy layers 4c2, 6b, and 8c2, in particular, one or more elements selected from the group of Ge, Sn, Ga, and Sb, can be prevented from being diffused to the nonmagnetic material layers 5 and 7.

Moreover, if the ratio a:b:c of the metal compound, which is the material of each of the CoMnX alloy layers 4c2, 6b, and 8c2 and whose compositional formula is represented by $Co_aMn_bX_c$ (X is one or more elements selected from the group of Ge, Sn, Ga, and Sb, a, b, and c are atomic percent, and a+b+c=100 atomic percent) is 2:1:1, the crystal structure of the CoMnX alloy layer becomes an $L_{21}$ type, and thus the spin-dependent bulk scattering coefficient β can be increased.

In addition, if the ratio d:e:f of the metal compound, which is the material of each of the CoMnZ alloy layers 4c1, 6a, 6c, and 8c1 and whose compositional formula is represented by $Co_dMn_eZ_f$ (Z is Al or Si, d, e, and f are atomic percent, and d+e+f=100 atomic percent), is 2:1:1, the crystal structure of the CoMnZ alloy layer becomes an $L_{21}$ type, and thus the spin-dependent bulk scattering coefficient β can be increased.

Figure 3:
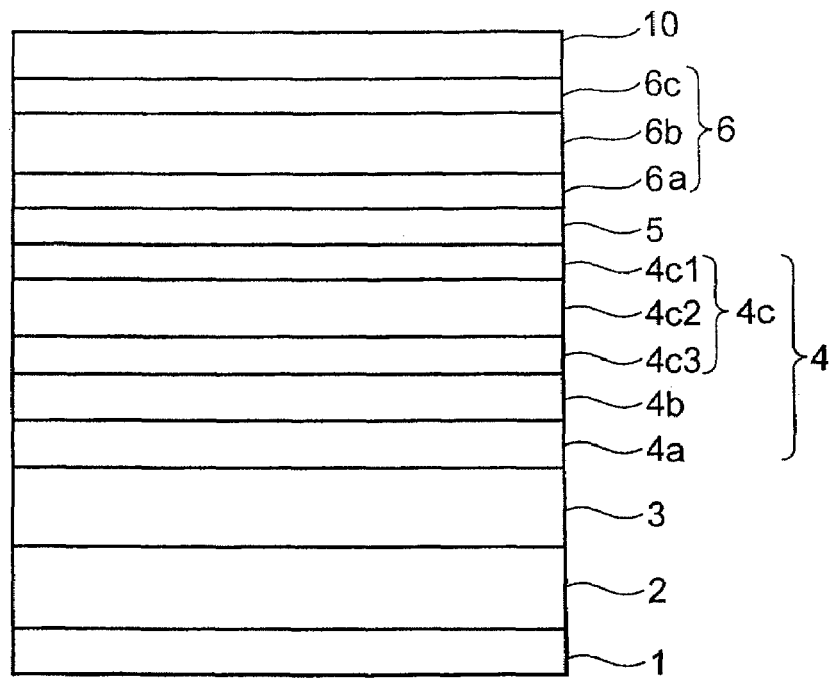
FIG. 3 is a schematic view showing a structure of a magnetic detecting element (dual spin-valve type thin film element) according to still another embodiment of the invention as viewed from an opposing surface to a recording medium.

FIG. 3 is a schematic view showing the film configuration of a CPP single spin-valve type thin film element. The same layers as those in FIG. 1 are represented by the same reference numerals.

The CPP single spin-valve type thin film element shown in FIG. 3 has the film configuration in which a base layer 1, a seed layer 2, an antiferromagnetic layer 3, a pinned magnetic layer 4, a nonmagnetic material layer 5, a free magnetic layer 6, and a protective layer 10 are laminated in that order from the bottom.

In the magnetic detecting element shown in FIG. 3, a second pinned magnetic layer 4c is also formed to have a three-layered structure of a CoMnZ alloy layer 4c1 in contact with a nonmagnetic material layer 5, a CoMnX alloy layer 4c2, and a nonmagnetic intermediate layer-side magnetic layer 4c3. Further, the free magnetic layer 6 also has a three-layered structure of a CoMnZ alloy layer 6a, a CoMnX alloy layer 6b, and a CoMnZ alloy layer 6c.

The CoMnX alloy layer is a layer formed of a metal compound whose compositional formula is represented by $Co_aMn_bX_c$ (X is one or more elements selected from the group of Ge, Sn, Ga, and Sb, a, b, and c are atomic percent, and a+b+c=100 atomic percent). Further, the CoMnZ alloy layer is a layer formed of a metal compound whose compositional formula is represented by $Co_dMn_eZ_f$ (Z is Al or Si, d, e, and f are atomic percent, and d+e+f=100 atomic percent).

In the magnetic detecting element shown in FIG. 3, the CoMnZ alloy layer exists between the CoMnX alloy layer and the nonmagnetic material layer. The element Z is Al, Si, or AlSi. The elements of a CoMnZ alloy are rarely diffused to the nonmagnetic material layer. For this reason, a ferromagnetic coupling magnetic field $H_{in}$ by magnetostatic coupling (topological coupling) between the free magnetic layer 6 and the lower pinned magnetic layer 4 can be reduced.

Further, by arranging the CoMnX alloy having a high spin-dependent bulk scattering coefficient β at a position distant from the nonmagnetic material layer, a product ΔRA of the amount of a change in magnetoresistance ΔR of the magnetic detecting element and an element area A can be maintained high.

As such, the magnetic detecting element shown in FIG. 3 can realize high reproduction power and reduce asymmetry of reproduction waveforms.

A preferable range of the film thickness of the CoMnZ alloy layer, and preferable compositional ratios of the CoMnX alloy layer and the CoMnZ alloy layer are the same as those of the magnetic detecting element in FIG. 1.

Moreover, a CoMnXZ alloy layer formed of a metal compound whose compositional formula is represented by $Co_gMn_hX_iZ_j$ (X is one or more elements selected from a group Ge, Sn, Ga, and Sb, Z is Al or Si, g, h, i, and j are atomic percent, and g+h+i+j=100 atomic percent) may be interposed between the CoMnX alloy layer and the CoMnZ alloy layer.

Further, the CPP single spin-valve type thin film element may be formed by laminating the free magnetic layer 6, the nonmagnetic material layer 5, the pinned magnetic layer 4, and the antiferromagnetic layer 3 in that order from the bottom.

Figure 4:
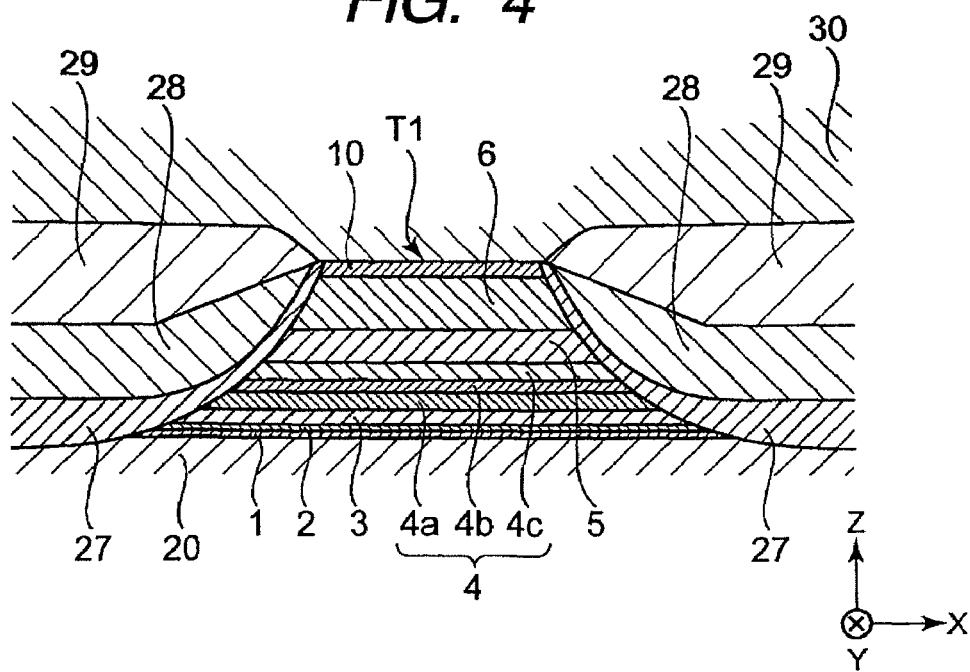
FIG. 4 is a partial cross-sectional view showing a reproducing head having the structure of the magnetic detecting element shown in FIG. 3 as viewed from the opposing surface to the recording medium.

FIG. 4 is a cross-sectional view showing a recording head having the structure of the CPP single spin-valve type thin film element shown in FIG. 3 as viewed from an opposing surface to a recording medium.

Reference numeral 20 denotes a lower shield layer 20 formed of a magnetic material. A multilayer film T1 is formed on the lower shield layer 20 to have the same film configuration as that shown in FIG. 3.

The multilayer film T1 is formed by laminating a base layer 1, a seed layer 2, an antiferromagnetic layer 3, a pinned magnetic layer 4, a nonmagnetic material layer 5, a free magnetic layer 6, and a protective layer 10 in that order from the bottom. In the embodiment shown in FIG. 4, insulating layers 27, hard bias layers 28, and insulating layers 29 are laminated on both sides of the multilayer film T1. The magnetization of the free magnetic layer 6 is aligned in a track width direction (X direction in FIG. 4) by a longitudinal bias magnetic field from the hard bias layers 28.

A bias base layer (not shown) may be formed between the insulating layer 27 and the hard bias layer 28. The base bias layer is formed of, for example, Cr, W, a W—Ti alloy, a Fe—Cr alloy, or the like.

The insulating layers 27 and 29 are formed of an insulating material, such as $Al_2O_3$ or $SiO_2$, and insulate the top and bottom of the hard bias layer 28 so as to prevent a current flowing in the multilayer film T1 in a direction perpendicular to the interface of each layer, from shunting on both sides in the track width direction of the multilayer film T1.

Moreover, the hard bias layers 28 and 28 are formed of, for example, a Co—Pt (cobalt-platinum) alloy, a Co—Cr—Pt (cobalt-chromium-platinum) alloy, or the like.

An upper shield layer 30 formed of a magnetic material is formed on the insulating layer 29 and the protective layer 10. In the CPP single spin-valve type thin film element, the lower shield layer 20 and the upper shield layer 30 function as electrodes, and serve as a current source that applies a current in a direction perpendicular to the interface of each layer constituting the multilayer film T1.

The magnetization of the free magnetic layer 6 is aligned in a direction parallel to the track width direction (X direction in FIG. 4) by a longitudinal bias magnetic field from the hard bias layers 28 and 28. Thus, the magnetization of the free magnetic layer 6 sensitively varies in response to a signal magnetic field (external magnetic field) from the recording medium. On the other hand, the magnetization of the pinned magnetic layer 4 is fixed in a direction parallel to the height direction (Y direction in FIG. 4).

The variation in magnetization direction of the free magnetic layer 6 relative to the fixed magnetization direction of the pinned magnetic layer 4 (in particular, the fixed magnetization direction of the second magnetic layer 4c) cause a variation in electrical resistance. The variation in voltage or current caused by the variation in electrical resistance allows the detection of a leakage field from the recording medium.

Figure 5:
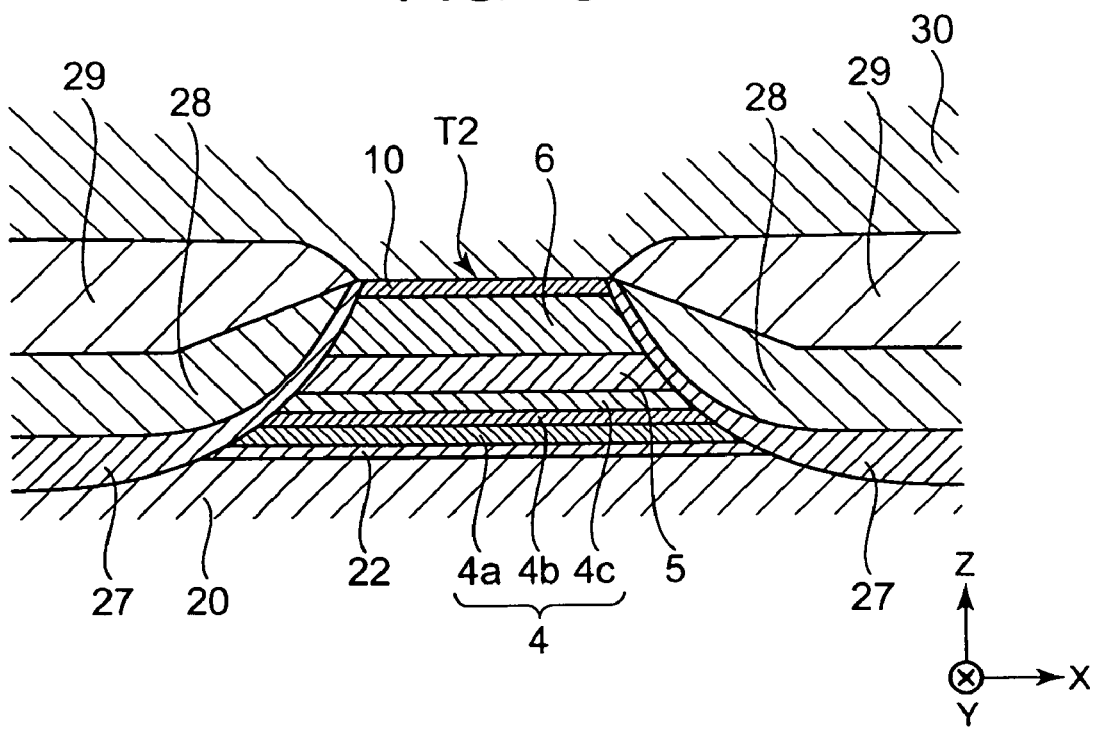
FIG. 5 is a partial cross-sectional view showing a reproducing head of a structure of a magnetic detecting element having a layer structure different from that shown in FIG. 4 as viewed from the opposing surface to the recording medium.

FIG. 5 is a cross-sectional view showing a recording head having the structure of a CPP single spin-valve type thin film element different from FIG. 4 as viewed from an opposing surface to the recording medium.

In FIG. 5, the antiferromagnetic layer 3 shown in FIG. 4 is not provided. FIG. 5 shows a so-called self-pinned magnetic detecting element in which the magnetization of a pinned magnetic layer 4 is fixed by a uniaxial anisotropy of the pinned magnetic layer itself.

In FIG. 5, a magnetostriction-enhancing layer 22 formed of one element selected from a group of Pt, Au, Pd, Ag, Ir, Rh, Ru, Re, Mo, and W, an alloy thereof, or a R—Mn (where R is one or more elements selected from a group of Pt, Pd, Ir, Rh, Ru, Os, Ni, and Fe) is formed below the pinned magnetic layer 4 to have a film thickness ranging from about 5 Å to 50 Å.

By increasing a magnetostriction constant λs of the pinned magnetic layer 4, magnetoelastic energy is increased, and thus a uniaxial anisotropy of the pinned magnetic layer 4 is increased. If the uniaxial anisotropy of the pinned magnetic layer is increased, the magnetization of the pinned magnetic layer 4 is strongly fixed in a predetermined direction, and the output of the magnetic detecting element is increased. Further, stability or asymmetry of the output can be enhanced.

In the magnetic detecting element shown in FIG. 5, the magnetostriction-enhancing layer 22 formed of a nonmagnetic metal is provided in contact with the first pinned magnetic layer 4a at a surface opposite to the nonmagnetic material layer 5 of the first pinned magnetic layer 4a constituting the pinned magnetic layer 4. This causes a distortion in a crystal structure of the first pinned magnetic layer 4a, in particular, on a lower side thereof. Accordingly, the uniaxial anisotropy of the pinned magnetic layer 4 is increased. Therefore, even when the antiferromagnetic layer 3 is not formed, the pinned magnetic layer 4 can be strongly fixed in the direction parallel to the height direction (Y direction in FIG. 5).

In FIGS. 4 and 5, the single spin-valve type thin film element has been particularly described, but the dual spin-valve type thin film element shown in FIG. 1 may be formed to have the same layer structure.

A dual spin-valve type magnetic detecting element having a laminated structure described below was formed. And then, the ferromagnetic coupling magnetic field $H_{in}$ between the free magnetic layer and the pinned magnetic layer, and the product ΔRA of the amount of the change in magnetoresistance ΔR of the magnetic detecting element and the element area A were measured.

SAMPLE 1: Substrate/base layer Ta (30 Å), seed layer NiFeCr (50 Å)/antiferromagnetic layer PtMn (170 Å)/first pinned magnetic layer $Co_{70}Fe_{30}$ (30 Å)/nonmagnetic intermediate layer Ru (9.1 Å)/second pinned magnetic layer $Co_{60}Fe_{40}$ (10 Å)/$(Co_{0.67}Mn_{0.33})_a Si_b$ (a and b are atomic percent, and a+b=100 atomic percent) (40 Å)/nonmagnetic material layer Cu (43 Å)/free magnetic layer $((Co_{0.67}Mn_{0.33})_a Si_b$ (a and b are atomic percent, and a+b=100 atomic percent) (80 Å))/nonmagnetic material layer Cu (43 Å)/second pinned magnetic layer $(Co_{0.67}Mn_{0.33})_a Si_b$ (a and b are atomic percent, and a+b=100 atomic percent) (40 Å)/$Co_{60}Fe_{40}$ (10 Å)/nonmagnetic intermediate layer Ru (9.1 Å)/first pinned magnetic layer $Co_{60}Fe_{40}$/antiferromagnetic layer PtMn (170 Å)/protective layer Ta (200 Å).

SAMPLE 2: Substrate/base layer Ta (30 Å)/seed layer NiFeCr (50 Å)/antiferromagnetic layer IrMn (70 Å)/first pinned magnetic layer $Co_{70}Fe_{30}$ (25 Å)/nonmagnetic intermediate layer Ru (9.1 Å)/second pinned magnetic layer $Co_{60}Fe_{40}$ (10 Å)/$(Co_{0.67}Mn_{0.33})_a Al_b$ (a and b are atomic percent, and a+b=100 atomic percent) (40 Å)/nonmagnetic material layer Cu (43 Å)/free magnetic layer $(Co_{0.67}Mn_{0.33})_a Al_b$ (a and b are atomic percent, and a+b=100 atomic percent) (80 Å)/nonmagnetic material layer Cu (43 Å)/second pinned magnetic layer $(Co_{0.67}Mn_{0.33})_a Al_b$ (a and b are atomic percent, and a+b=100 atomic percent) (40 Å)/$Co_{60}Fe_{40}$ (10 Å)/nonmagnetic intermediate layer Ru (9.1 Å)/first pinned magnetic layer $Co_{60}Fe_{40}$ (25 Å)/antiferromagnetic layer IrMn (70 Å)/protective layer Ta (200 Å).

Moreover, at the time of forming the magnetic detecting elements of SAMPLE 1 and SAMPLE 2, the thermal treatment was performed at a temperature of 290° C.

In SAMPLE 1, layers formed of $(Co_{0.67}Mn_{0.33})_a Si_b$ (a and b are atomic percent, and a+b=100 atomic percent) are formed on the sides of the second pinned magnetic layer and the free magnetic layer in contact with the nonmagnetic material layer. While the ratio between Co and Mn of $(Co_{0.67}Mn_{0.33})_aSi_b$ (a and b are atomic percent, and a+b=100 atomic percent) is maintained in 2:1, when the compositional ratio of Si is changed, the ferromagnetic coupling magnetic field $H_{in}$ between the free magnetic layer and the pinned magnetic layer of the dual spin-valve type magnetic detecting element, and the product ΔRA of the amount of the change in magnetoresistance ΔR of the magnetic detecting element and the element area A were measured.

Figure 6:
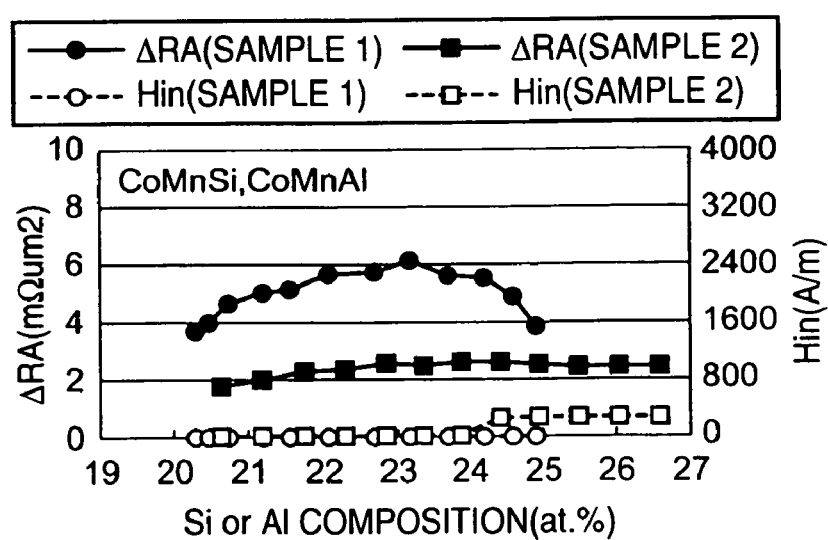
FIG. 6 is a graph showing, when a dual spin-valve type magnetic detecting element is formed, and a side of a second pinned magnetic layer brought into contact with a nonmagnetic material layer, and a side of a free magnetic layer brought into contact with the nonmagnetic material layer are formed of $(CO_{0.67}Mn_{0.33})_aSi_b$ alloy or $(CO_{0.67}Mn_{0.33})_aAl_b$ alloy, measurement results of a ferromagnetic coupling magnetic field $H_{in}$ between the free magnetic layer and the pinned magnetic layer, and a product ΔRA of the amount of a change in magnetoresistance ΔR of the magnetic detecting element and an element area A.

In SAMPLE 2, layers formed of $(Co_{0.67}Mn_{0.33})_aAl_b$ (a and b are atomic percent, and a+b=100 atomic percent) are provided on sides of the second pinned magnetic layer and the free magnetic layer in contact with the nonmagnetic material layer. While the ratio between Co and Mn of $(Co_{0.67}Mn_{0.33})_a Al_b$ (a and b are atomic percent, and a+b=100 atomic percent) is maintained in 2:1, when the compositional ratio of Al is changed, the ferromagnetic coupling magnetic field $H_{in}$ between the free magnetic layer and the pinned magnetic layer of the dual spin-valve type magnetic detecting element, and the product ΔRA of the amount of the change in magnetoresistance ΔR of the magnetic detecting element and the element area A were measured. The results are shown in FIG. 6.

In the magnetic detecting element of SAMPLE 1, even when the compositional ratio of Si of the $(Co_{0.67}Mn_{0.33})_aSi_b$ alloy (a and b are atomic percent, and a+b=100 atomic percent) (horizontal axis in a graph of FIG. 6) is changed in a range of 20 atomic percent to 26.5 atomic percent, the ferromagnetic coupling magnetic field $H_{in}$ between the free magnetic layer and the pinned magnetic layer is 0 A/m. In the magnetic detecting element of SAMPLE 2, even when the compositional ratio of Al of the $(Co_{0.67}Mn_{0.33})_aAl_b$ alloy (a and b are atomic percent, and a+b=100 atomic percent) (horizontal axis in a graph of FIG. 6) is changed in a range of 20 atomic percent to 26.5 atomic percent, the ferromagnetic coupling magnetic field $H_{in}$ between the free magnetic layer and the pinned magnetic layer is equal to or less than 200 A/m.

As such, if the side of the second pinned magnetic layer in contact with the nonmagnetic material layer, and the free magnetic layer are formed of the $(Co_{0.67}Mn_{0.33})_aSi_b$ alloy or the $(Co_{0.67}Mn_{0.33})_aAl_b$ alloy, the ferromagnetic coupling magnetic field $H_{in}$ between the free magnetic layer and the pinned magnetic layer can be reduced.

However, ΔRA of the magnetic detecting element of SAMPLE 1 is made small, that is, 6 mΩμm² or less. Further, ΔRA of the magnetic detecting element of SAMPLE 2 is made small, that is, 3 mΩμm² or less.

Next, the side of the second pinned magnetic layer in contact with the nonmagnetic material layer, and the free magnetic layer were formed of a $(Co_{0.67}Mn_{0.33})_aGe_b$ alloy so as to form a dual spin-valve type magnetic detecting element. When the atomic percent of Ge of $(Co_{0.67}Mn_{0.33})_aGe_b$ (a and b are atomic percent, and a+b=100 atomic percent), which is the material for the second pinned magnetic layer or the free magnetic layer, is changed, the ferromagnetic coupling magnetic field $H_{in}$ between the free magnetic layer and the pinned magnetic layer, and the product ΔRA of the amount of the change in magnetoresistance ΔR of the magnetic detecting element and the element area A were measured. The film configuration of the dual spin-valve type magnetic detecting element is as follows.

Substrate/base layer Ta (30 Å)/seed layer NiFeCr (50 Å)/antiferromagnetic layer IrMn (70 Å)/first pinned magnetic layer $Co_{70}Fe_{30}$ (30 Å)/nonmagnetic intermediate layer Ru (9.1 Å)/second pinned magnetic layer $Co_{60}Fe_{40}$ (10 Å)/ $(Co_{0.67}Mn_{0.33})_aGe_b$ (a and b are atomic percent, and a+b=100 atomic percent) (40 Å)/nonmagnetic material layer Cu (43 Å)/free magnetic layer $(Co_{0.67}Mn_{0.33})_aGe_b$ (a and b are atomic percent, and a+b=100 atomic percent) (80 Å)/nonmagnetic material layer Cu (43 Å)/second pinned magnetic layer $(Co_{0.67}Mn_{0.33})_aGe_b$ (a and b are atomic percent, and a+b=100 atomic percent) (40 Å)/$Co_{60}Fe_{40}$ (10 Å)/nonmagnetic intermediate layer Ru (9.1 Å)/first pinned magnetic layer $Co_{60}Fe_{40}$ (30 Å)/antiferromagnetic layer IrMn (70 Å)/protective layer Ta (200 Å)

Moreover, at the time of forming the magnetic detecting element, the thermal treatment was performed at a temperature of 290° C.

Figure 7:
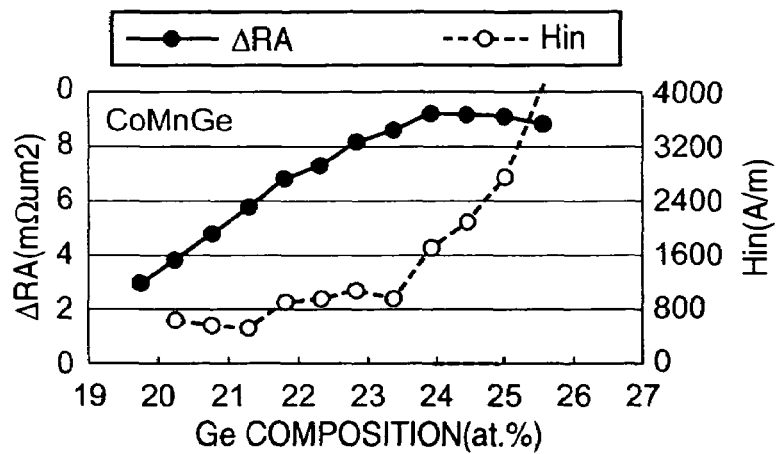
FIG. 7 is a graph showing, when a dual spin-valve type magnetic detecting element is formed, and a side of a second pinned magnetic layer brought into contact with a nonmagnetic material layer, and a free magnetic layer are formed of $(CO_{0.67}Mn_{0.33})_aGe_b$ alloy, measurement results of a ferromagnetic coupling magnetic field $H_{in}$ between the free magnetic layer and the pinned magnetic layer and a product ΔRA of the amount of a change in magnetoresistance ΔR of the magnetic detecting element and an element area A.
Figure 8:
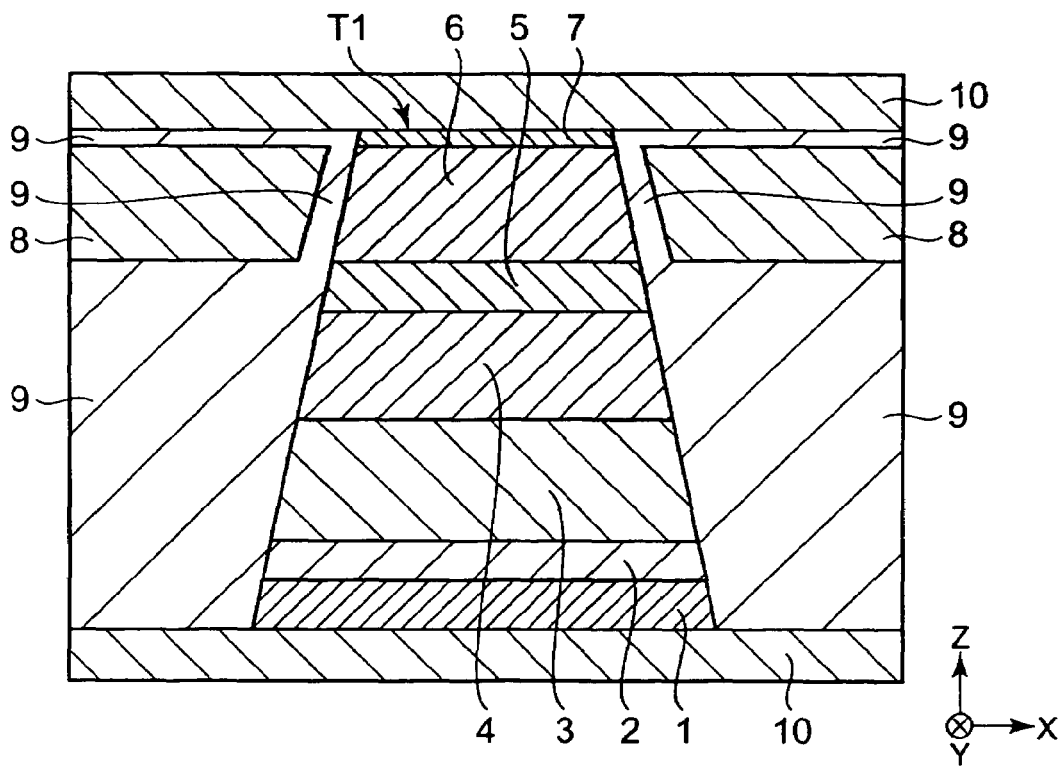
FIG. 8 is a cross-sectional view showing a structure of a magnetic detecting element (single spin-valve type magnetoresistive element) according to the related art as viewed from an opposing surface to a recording medium.
Figure 9:
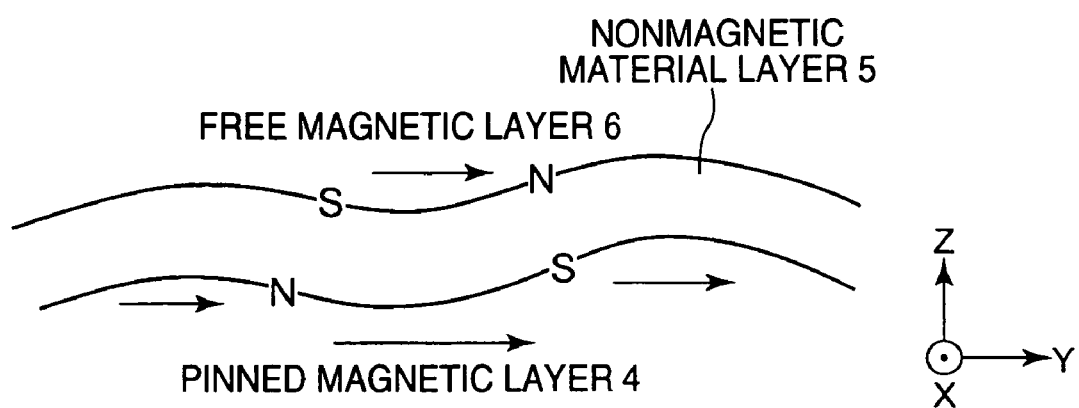
FIG. 9 is a partial cross-sectional view of the magnetic detecting element shown in FIG. 8 on a magnified scale.

The results are shown in FIG. 7. From FIG. 7, it can be understood that, as Ge of the $(Co_{0.67}Mn_{0.33})_aGe_b$ (a and b are atomic percent, and a+b=100 atomic percent) alloy of the free magnetic layer is increased, ΔRA of the magnetic detecting element is increased, and also the ferromagnetic coupling magnetic field $H_{in}$ between the free magnetic layer and the pinned magnetic layer can be increased.

If Ge of the $(Co_{0.67}Mn_{0.33})_aGe_b$ (a and b are atomic percent, and a+b=100 atomic percent) alloy gets near to 25 atomic percent, in the $(Co_{0.67}Mn_{0.33})_aGe_b$ (a and b are atomic percent, and a+b=100 atomic percent) alloy, a Heusler crystal structure of an $L2_1$ type is dominant. For this reason, when the content of Ge in the $(Co_{0.67}Mn_{0.33})_aGe_b$ (a and b are atomic percent, and a+b=100 atomic percent) alloy is in a range of 24 atomic percent to 26 atomic percent, ΔRA of the magnetic detecting element and the element area A is maximized.

Further, if the content of Ge in the $(Co_{0.67}Mn_{0.33})_aGe_b$ (a and b are atomic percent, and a+b=100 atomic percent) alloy is 24 atomic percent or less, the ferromagnetic coupling magnetic field $H_{in}$ between the free magnetic layer and the pinned magnetic layer is abruptly decreased.

With the combination of the results of FIGS. 6 and 7, if the sides of the second pinned magnetic layer and the free magnetic layer in contact with the nonmagnetic material layer are formed of the $(Co_{0.67}Mn_{0.33})_aSi_b$ alloy or the $(Co_{0.67}Mn_{0.33})_aAl_b$ alloy and are superimposed on the layers formed of the $(Co_{0.67}Mn_{0.33})_aSi_b$ alloy or the $(Co_{0.67}Mn_{0.33})_aAl_b$ alloy so as to form the layers formed of the $(Co_{0.67}Mn_{0.33})_aGe_b$ alloy (a and b are atomic percent, and a+b=100 atomic percent), it can be understood that, while maintaining ΔRA of the magnetic detecting element high, the ferromagnetic coupling magnetic field $H_{in}$ between the free magnetic layer and the pinned magnetic layer can be reduced.

From the results, in the magnetic detecting element having the pinned magnetic layer whose magnetization direction is fixed in one direction, and the free magnetic layer formed on the pinned magnetic layer with the nonmagnetic material layer interposed therebetween, if one or both of the pinned magnetic layer and the free magnetic layer has a laminated structure of a CoMnX alloy layer formed of the metal compound whose compositional formula is represented by $Co_aMn_bX_c$ (X is one or more elements selected from the group of Ge, Sn, Ga, and Sb, a, b, and c are atomic percent, a+b+c=100 atomic percent), and a magnetic coupling-preventing layer, and the magnetic coupling-preventing layer is located on the side of the nonmagnetic material layer, it can be understood that, while maintaining ΔRA of the magnetic detecting element high, the ferromagnetic coupling magnetic field $H_{in}$ between the free magnetic layer and the pinned magnetic layer can be reduced.

Here, the magnetic coupling-preventing layer is a layer formed of a half-metal ferromagnetic material such that, when a pair of thin films formed of the ferromagnetic material are laminated with a Cu layer having a thickness of 43 Å interposed therebetween, a ferromagnetic coupling magnetic field $H_{in}$ is 1600 A/m or less. As a specified example of the magnetic coupling-preventing layer, the $(Co_{0.67}Mn_{0.33})_aSi_b$ alloy or the $(Co_{0.67}Mn_{0.33})_aAl_b$ alloy can be exemplified.

The invention claimed is:

1. A magnetic detecting element comprising:
a pinned magnetic layer whose magnetization direction is fixed in one direction; and
a free magnetic layer that is formed on the pinned magnetic layer with a nonmagnetic material layer interposed therebetween,
wherein one or both of the pinned magnetic layer and the free magnetic layer have a laminated structure of a CoMnX alloy layer formed of a metal compound whose compositional formula is represented by CoaMnbXc (X is one or more elements selected from a group of Ge, Sn, Ga, and Sb, a, b, and c are atomic percent, and a+b+c=100 atomic percent) and a CoMnZ alloy layer formed of a metal compound whose compositional formula is represented by CodMneZf (Z is Al or Si, d, e, and f are atomic percent, and d+e+f=100 atomic percent), and
the CoMnZ alloy layer is located close to the nonmagnetic material layer.

2. The magnetic detecting element according to claim 1, wherein, between the CoMnX alloy layer and the CoMnZ alloy layer, a CoMnXZ alloy layer formed of a metal compound whose compositional formula is represented by CogMnhXiZj (X is one or more elements selected from a group Ge, Sn, Ga, and Sb, Z is Al or Si, g, h, i, and j are atomic percent, and g+h+i+j=100 atomic percent) is interposed.

3. The magnetic detecting element according to claim 2, wherein, in the CoMnXZ alloy layer, a region where, as getting near to the nonmagnetic material layer, the concentration of the element X becomes lower and the concentration of the element Z become higher exists.

4. The magnetic detecting element according to claim 1, wherein the film thickness of the CoMnZ alloy layer is in a range of 1 Å to 10 Å.

5. The magnetic detecting element according to claim 1, wherein an atomic ratio a:b:c is 2:1:1.

6. The magnetic detecting element according to claim 1, further comprising:
an antiferromagnetic layer,
wherein the pinned magnetic layer is formed to be brought into contact with the antiferromagnetic layer, such that the magnetization direction thereof is fixed by an exchange anisotropy magnetic field with the antiferromagnetic layer, and
the free magnetic layer is formed on the pinned magnetic layer with the nonmagnetic material layer interposed therebetween.

7. The magnetic detecting element according to claim 1, wherein the nonmagnetic material layer has nonmagnetic material layers that are laminated above and below the free magnetic layer, and
the pinned magnetic layer has pinned magnetic layers that are located above one of the nonmagnetic material layers and below the other nonmagnetic material layer.

8. The magnetic detecting element according to claim 7, further comprising:
antiferromagnetic layers that are located above one of the pinned magnetic layers and below the other pinned magnetic layer so as to fix the magnetization directions of the individual pinned magnetic layers in a predetermined direction by an exchange an isotropy magnetic field.

9. The magnetic detecting element according to claim 1, wherein a sense current flows in a direction perpendicular to the film surface of each of the pinned magnetic layer, the nonmagnetic material layer, and the free magnetic layer.

10. A magnetic detecting element comprising:
a pinned magnetic layer whose magnetization direction is fixed in one direction; and
a free magnetic layer that is formed on the pinned magnetic layer with a nonmagnetic material layer interposed therebetween,
wherein one or both of the pinned magnetic layer and the free magnetic layer have a laminated structure of a CoMnX alloy layer formed of a metal compound whose compositional formula is represented by CoaMnbXc (X is one or more elements selected from a group of Ge, Sn, Ga, and Sb, a, b, and c are atomic percent, and a+b+c=100 atomic percent), and a magnetic coupling-preventing layer,
the magnetic coupling-preventing layer is located close to the nonmagnetic material layer, and
the magnetic coupling-preventing layer is formed of a half-metal ferromagnetic material, such that, when a pair of thin films formed of the ferromagnetic material are laminated with a Cu layer having a thickness of 43 Å interposed therebetween, a ferromagnetic coupling magnetic field Hin is 1600 A/m or less.

11. A method of manufacturing a magnetic detecting element, the magnetic detecting device having a pinned magnetic layer whose magnetization direction is fixed, and a free magnetic layer that is formed on the pinned magnetic layer with a nonmagnetic material layer interposed therebetween, and whose magnetization direction is changed by an external magnetic field, the method of manufacturing a magnetic detecting element comprising:
forming one or both of the pinned magnetic layer and the free magnetic layer to have a laminated structure of a CoMnX alloy layer formed of a metal compound whose compositional formula is represented by CoaMnbXc (X is one or more elements selected from a group of Ge, Sn, Ga, and Sb, a, b, and c are atomic percent, and a+b+c=100 atomic percent) and a CoMnZ alloy layer formed of a metal compound whose compositional formula is represented by CodMneZf (Z is Al or Si, d, e, and f are atomic percent, and d+e+f=100 atomic percent),
wherein the CoMnZ alloy layer is located close to the nonmagnetic material layer.

12. The method of manufacturing a magnetic detecting element according to claim 11, further comprising:
after laminating the CoMnX alloy layer and the CoMnZ alloy layer, performing a thermal treatment.

13. The method of manufacturing a magnetic detecting element according to claim 12,
wherein, between the CoMnX alloy layer and the CoMnZ alloy layer, a CoMnXZ alloy layer formed of a metal compound whose compositional formula is represented by CogMnhXiZj (X is one or more elements selected from a group Ge, Sn, Ga, and Sb, Z is Al or Si, g, h, i, and j are atomic percent, and g+h+i+j=100 atomic percent) is formed.

14. The method of manufacturing a magnetic detecting element according to claim 13,
wherein, in the CoMnXZ alloy layer, a region where, as getting near to the nonmagnetic material layer, the concentration of the element X becomes lower and the concentration of the element Z become higher exists.

15. The method of manufacturing a magnetic detecting element according to claim 11,
wherein the film thickness of the CoMnZ alloy layer is in a range of 1 Å to 10Å.

16. The method of manufacturing a magnetic detecting element according to claim 11,
wherein an atomic ratio a:b:c is 2:1:1.

* * * * *